United States Patent [19]

Lee

[11] 4,355,974
[45] Oct. 26, 1982

[54] WAFER BOAT

[75] Inventor: Eui-Wan Lee, Eggertsville, N.Y.

[73] Assignee: ASQ Boats, Inc., Torrance, Calif.

[21] Appl. No.: 209,905

[22] Filed: Nov. 24, 1980

[51] Int. Cl.³ .............................................. B05C 13/02
[52] U.S. Cl. ........................................ 432/253; 432/5;
432/261; 118/500; 118/729; 118/725; 118/900;
211/40; 211/41
[58] Field of Search ............... 118/728, 500, 729, 715,
118/725; 211/40, 41; 432/253, 5, 261

[56] References Cited

U.S. PATENT DOCUMENTS

| | | | |
|---|---|---|---|
| 3,486,631 | 12/1969 | Radman | 118/500 X |
| 3,610,613 | 10/1971 | Worden | 211/41 X |
| 3,678,893 | 7/1972 | Bell | 118/500 |
| 3,826,377 | 7/1974 | Bachmann | 118/500 X |
| 3,922,467 | 11/1974 | Pinchon | 118/728 X |
| 3,998,333 | 12/1976 | Kamada | 118/500 X |
| 4,129,090 | 12/1978 | Inaniwa et al. | 118/728 |
| 4,256,229 | 3/1981 | Lee | 211/41 |

FOREIGN PATENT DOCUMENTS

| | | | |
|---|---|---|---|
| 54-125975 | 9/1979 | Japan | 118/500 |
| 55-98826 | 7/1980 | Japan | 118/728 |
| 1436503 | 5/1976 | United Kingdom | 211/41 |

Primary Examiner—John D. Smith
Assistant Examiner—Bernard F. Plantz
Attorney, Agent, or Firm—Knobbe, Martens, Olson, Hubbard & Bear

[57] ABSTRACT

A wafer processing boat is provided with parallel slots that support each wafer at a slight angle with respect to vertical so that the wafers lean by gravity in a uniform manner and are thereby arranged in spaced parallel relationship. This enables the tolerances within the slots to be quite large with respect to the width of the wafer edges thus facilitating insertion and removal of the wafers while minimizing wafer damage and increasing wafer processing uniformity.

10 Claims, 10 Drawing Figures

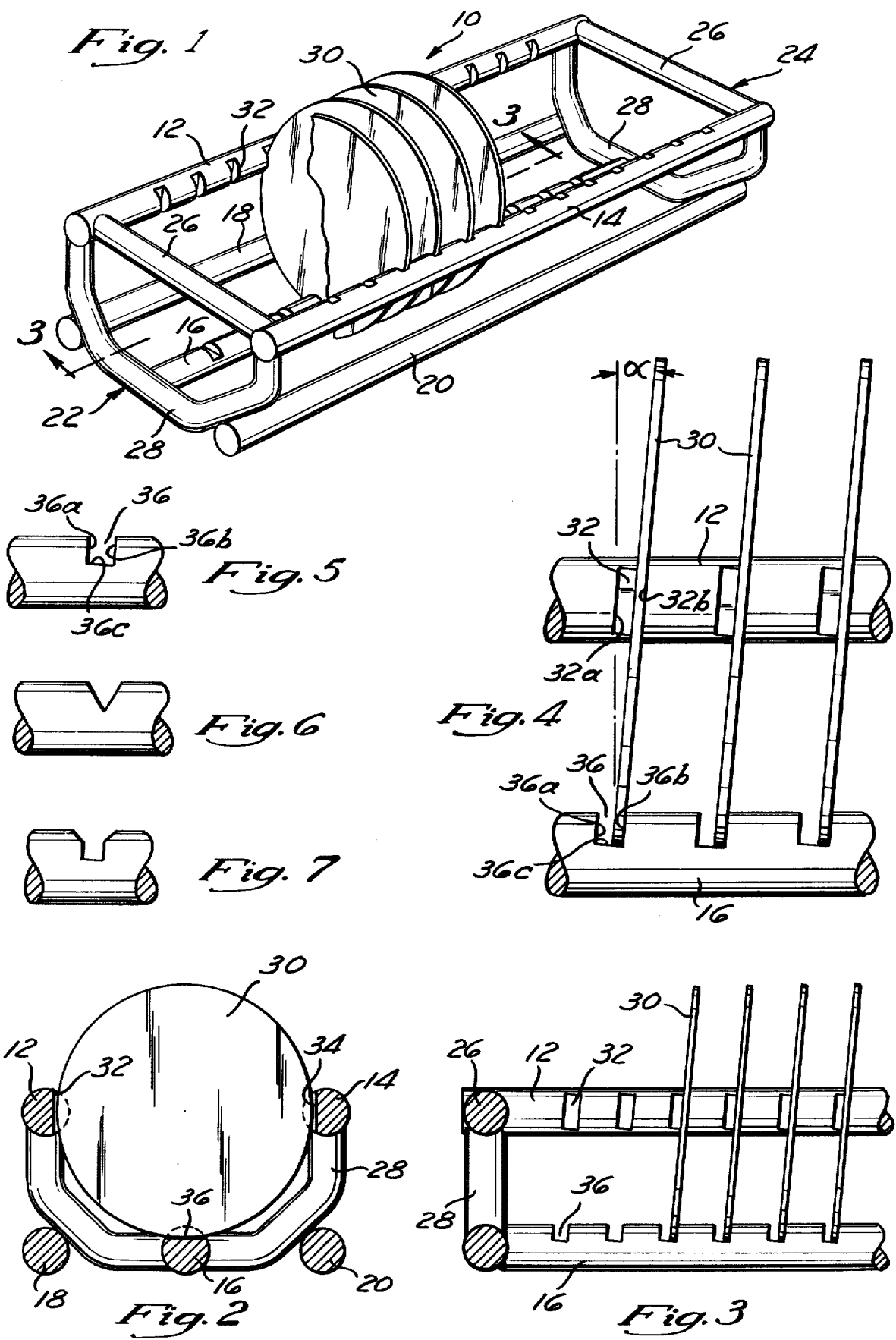

WAFER BOAT

BACKGROUND OF THE INVENTION

This invention relates to an improved carrier, commonly referred to as a boat or basket, for carrying or supporting semiconductor wafers during processing of the wafers.

As is well known, semiconductor wafers are commonly subjected to a variety of processing steps. For example, the wafers are loaded into a quartz boat and inserted into a high temperature furnace for oxidation, diffusion, annealing and low pressure chemical vapor deposition. When the high temperature treatment is completed, the wafers are pulled out to room temperature. The wafers are then unloaded and sent to the next processing step.

The wafers are commonly supported edgewise in a boat in generally spaced, parallel vertical, relation during the processing steps. Normally, the wafers are only contacted on their edges at spaced locations around the periphery of the edge. This maximizes the surface area of the wafer exposed during processing and supports the wafer in a manner to minimize gravitational stress on the wafer. The uniform, parallel spacing is desirable so that each wafer is subjected to uniform treatment during a processing step.

In one type of known carrier a pair of spaced parallel rods are provided with slots for receiving the lower edges of a wafer in ladderlike relation. In another design, four parallel support rods are provided with slots for receiving sides edges of a wafer. In seeking to obtain the goal of uniform spacing, the width of the slots receiving the wafer edges have normally been made only slightly larger than the thickness of the wafer edge. This results in some rods being completely vertical and others leaning at various angles in either direction due to dimensional variation. If the slots are made significantly larger than the wafer edge, the wafers do not extend completely vertically but instead randomly lean one way or the other, which means that the space between one pair of wafers may not be uniform with the space between an adjacent pair of wafers. With either approach, the result is that the completed wafers do not have sufficiently similar characteristics thus providing an undesirably low acceptability yield. This results in wasted, expensive wafers and processing.

If the slots are made so that a wafer fits snugly within a slot, there are problems of breakage and chipping when a wafer is installed in the slot. Additionally, there are expansion and contraction forces which occur during heating of the wafers and the carrier. Thus, a wafer may not be free to expand and contract without stress if its supporting slot is too tight. This causes warpage which reduces the accuracy of patterns or circuits applied to the wafer. In addition, there are variations in thickness of wafers which in turn places limitations on the tolerances that may be used in forming the slots. Further, with small tolerances, it is difficult to align the slots of adjacent rods accurately, with the result that there can be binding or rubbing problems even if an individual slot is sufficiently large with respect to the wafer edge.

As a consequence of these various problems, there has been considerable loss due to wafer breakage and unacceptable uniformity of wafer processing. A need exists for an improved carrier for handling such wafers.

SUMMARY OF THE INVENTION

In accordance with the present invention, an improved wafer carrier is provided having wafer supporting slots which are larger in width than those of the prior art so that wafers can be inserted and withdrawn from the carrier slots without chipping or breaking. To solve the problem of uniform spacing between wafers and thereby retaining uniform processing, the slots walls are oriented at a slight angle with respect to the vertical, and the wafers engage the slot walls to be oriented at the same angle. This arrangement adequately supports the wafers in a desired edgewise position, and the slightly tilted angle causes each wafer to lean in the same direction rather than being able to flop in alternate directions. This simple technique greatly improves the manner of handling semiconductor wafers both from a standpoint of minimizing breakage and from the standpoint of uniformity of the finished product.

In a preferred form of the carrier, the wafers are supported by three spaced parallel rods, a lower rod receiving the lower edge of the wafer and a pair of spaced side rods receiving the outer side edges of a wafer. The slots in these rods are formed to tilt by gravity each wafer slightly at the desired angle, in spaced parallel relation.

Another shortcoming of the currently used wafer boats is that as the boat is pushed into a furnace having a cylindrical interior cross section, there is a tendency for the boat to not move in a straight line, but instead to move up the sides of the furnace which can cause wafer tipping and possible breakage. This appears to be due to the fact that currently the boat is pushed into the furnace by use of a rod-shaped hook having a curved exterior which engages the curved edge of a transverse rod on the forward end of the boat. As another feature of the improved carrier of the invention, this problem is greatly improved by the simple expedient of forming a centrally located recess in the forward edge of the forward rod on the boat for receiving the hook and thereby be properly located and confined in this location during the pushing process. Consequently, it is much easier to push a boat in a straight line into a furnace.

BRIEF DESCRIPTION OF THE FIGURES

FIG. 1 is a perspective view of a carrier supporting a plurality of wafers in spaced parallel relation;

FIG. 2 is a cross-sectional view of the carrier of FIG. 1;

FIG. 3 is a cross-sectional view of the carrier of FIG. 1 along the line 3—3;

FIG. 4 is an enlargement of a portion of the carrier of FIG. 3;

FIGS. 5, 6 and 7 show cross-sectional views of various slot configurations for receiving the edges of a wafer;

Figure 8:
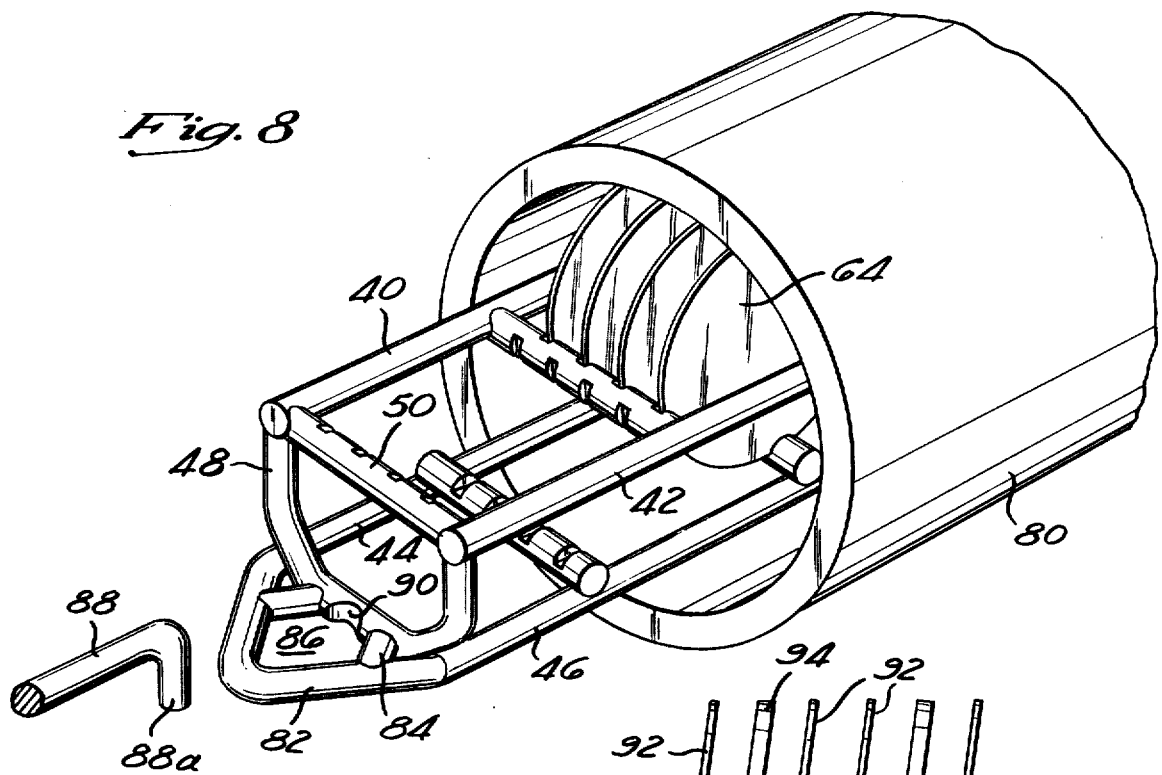
FIG. 8 is a perspective view of another embodiment of a wafer carrier partially positioned within a cylindrical furnace and including an improved arrangement for pushing a carrier into the furnace.

Referring first to FIGS. 1 through 3, there is shown a wafer carrier 10 which may be called a boat or a basket. The boat has a rodlike frame including a pair of upper, wafer supporting side rods 12 and 14, a lower, centrally located, wafer supporting rod 16, and a pair of lower, boat supporting side rods 18 and 20. These rods are joined and held in spaced parallel relation by a pair of transversely extending end frames 22 and 24. Each end frame includes a rod 26 extending horizontally with its ends secured to the upper side rod 12 and 14, and a curved, somewhat U-shaped rodlike frame member 28 having its upper ends secured to the lower sides of the rods 12 and 14, and having its outer lower sides secured to the inner sides of the ends of the support rods 18 and 20. Each end of the lower wafer support rod 16 is secured to the lower inner side of a frame member 28.

The wafer support rods 12, 14 and 16 together with the end frames 22 and 24 define a basketlike space for receiving a plurality of disc-shaped wafers, examples of which are identified by the numeral 30. As can be seen, the rods 12, 14 and 16 are provided with inwardly facing slots which receive the edges of the wafers 30 to support the wafers in edgewise position, as shown in FIG. 1. More specifically, the side rod 12 is formed with a plurality of equally-spaced parallel slots 32 which face toward the interior of the carrier, the slot extending into the rod somewhat less than half of the diameter as may be seen from FIG. 2. A slot 32 receives one side edge portion of a wafer 30. Similarly the rod 14 is provided with a plurality of spaced parallel slots 34 along its inner edge to receive an opposite side edge portion of a wafer 30; and the lower rod 16 is provided with a plurality of spaced parallel slots 36 on its upper surface which face towards the interior of the carrier 10 to receive a lower edge of a wafer 30.

In accordance with the invention, the slots 32, 34 and 36 do not extend completely vertical as in the prior art, but instead extend at a slight angle with respect to vertical. Or, stated differently, a slot extends at a slight angle with respect to a radial plane of its rod. This angle $\alpha$ is illustrated in the enlarged view of FIG. 4, with the line 38 representing a vertical radial reference line. Preferably, the angle $\alpha$ is about two degrees. It is shown in exaggerated form in FIG. 4 to make it more noticeable. The purpose for the angle is to cause each of the wafers 30 to lean automatically in the same direction so that they are in spaced parallel relation as shown in FIG. 4. This is in contrast to wafers that randomly lean in either direction when the slots extend completely vertically. It should be understood that an angle greater than two degrees can be employed but two degrees is sufficient to cause the wafers to lean uniformly, and increasing the angle increases bending stresses across the faces of the wafers due to a wafer's own weight.

In addition to having the slots angled, it is desirable that they be relatively large in width with respect to the thickness of the wafer. A slot width range of 0.010 to 0.030 inches greater than the wafer width is satisfactory. With a wafer thickness of 0.020 inches, it is desirable that the slot width be in the range of 0.034 to 0.045 inches. Or, for a wafer of 0.020 inches thickness, the slot is approximately twice as wide. The purpose for having the slots considerably larger than the thickness of the wafer is to facilitate insertion and removal of the disc, bearing in mind that some tolerance is needed simply for manufacturing imperfections, the wafers expand and contract during heating operations at rates different from the carrier, and wafers of a particular nominal size have dimensional variations. This is in contrast with the prior art approach wherein the slots are only very slightly larger than the thickness of a wafer. This is necessary with vertical slots to prevent leaning a significant amount in either direction which would result in nonuniform wafer processing. In making narrow slots to minimize this problem, the corresponding problems of tight fit between the slot and the wafer resulted. This in turn causes chipping and breakage of wafers during insertion and removal and also causes undesirable stresses to be incurred during the heating and other processing of a wafer. It is important that a wafer be able to move freely during expansion and contraction so as not to introduce undesirable stresses or warpage.

In this connection, it should be noted that the wafers should not be restricted in a side to side direction either. Thus, it is important that the rods 12 and 14 be accurately spaced so as to support the smallest size wafer expected to be placed in that carrier and yet allow sufficient space for the largest diameter wafer expected to be installed in that carrier. The positioning of the horizontal rods 26 is determinative of that spacing.

Referring to FIGS. 4 and 5, it may be seen that the slot 36 has a generally U-shaped configuration with two parallel side walls 36a and 36b and a bottom wall 36c. The wafer 30 is shown positioned leaning against the side wall 36b and resting on that side of the bottom wall 36c. Similarly, the side edge of the wafer positioned in slot 32 in rod 12 leans against the slot wall 32b rather than the slot wall 32a. To assist the wafer 30 in leaning in that direction, the bottom wall 36c of the slot 36 may be angled slightly from horizontal so that the wafer will remain in the lower corner when placed there. If the slots 32, 34 and 36 are made in a single cutting operation after the carrier rods have been assembled, the angle of the bottom wall 36 would be the same as the vertical tilt angle $\alpha$ if a square edged cutter is employed. Of course, larger angles may also be utilized. Further, another way of manufacturing the carrier is to cut or otherwise form the slots in the rods before the carrier is assembled. In this regard, it should be noted that the slots 32 and 36 angle in opposite directions when the rods are placed side by side, with the slot opening in the same direction. Thus, these rods are not interchangeable. Similarly, the slot in the bottom or lower rod 16 is formed slightly differently from the side rods in order to result in the desired tilt angle when the rods are assembled into the carrier illustrated in FIG. 1.

As a further means to properly locate or orient a wafer, the slots in the lower rod 16 may be given a V-shape as shown in FIG. 6, while the slots in the side rods 12 and 14 are U-shaped or Y-shaped as shown in FIG. 7. With this arrangement, the V-shaped lower slot insures that the lower ends of the wafers are uniformly positioned and the angle of the slot walls in the upper side rods cause the wafers to lean uniformly in the desired direction.

One other feature of the arrangement shown in FIG. 1 is that having a centrally located, lower wafer supporting rod is convenient with wafers provided with a small flat edge surface for orientation purposes. It is desirable that some wafers be positioned in a carrier with the wafers located at the same circumferential orientation. This is normally accomplished by taking care in inserting the wafers. With the design of the carrier of FIG. 1, the flat side of a wafer may be oriented downwardly to engage the slot 36 in the lower support rod 16. If the wafers are not precisely positioned with the flat centered with respect to the support rod 16, the wafer is somewhat self-aligning since the flat edge tends to engage the bottom wall of the flat 36 when the carrier is slightly jiggled, such as typically occurs to some extent when a carrier is moved into a processing furnace.

In summary, the angled slots in the carrier provide very equal and parallel spacing between wafers, which results in uniform wafer heating and gas flow between wafers. The wide slot width provides room for thermal expansion of wafers without introducing strain and warpage to the wafers and further facilitates easy loading and removal of wafers without chipping or breaking. Further, even with the relatively large slot width, the wafers can be highly packed since each wafer tilts or leans in the same direction. This factor is particularly noticeable with respect to large diameter wafers such as four inches in that random leaning that results in completely vertically oriented slots could result in adjacent wafers touching each other near the top if they should lean towards each other unless adequately spacing of slots is utilized.

Figure 10:
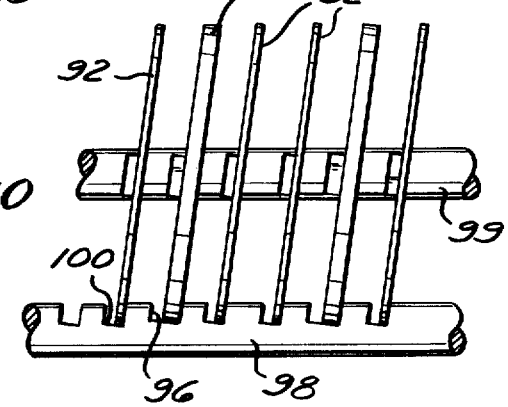
FIG. 10 is a side elevational view of a modified form of carrier having slots for receiving diffusion wafers.

In the wafer boat slot arrangements described above, the slots are all equally spaced and of equal width to receive one size of device wafer, whether it be made of silicon, germanium, garium arsenide, garium phosphide, magnetic garnet, silicon-on-sapphire or other material. However, in some situations it is necessary to hold diffusion source wafers and device wafers in the same boat. For example, to diffuse boron into silicon wafers, silicon wafers are placed adjacent to boron nitride wafers as shown in FIG. 10, wherein a diffusion source water 94 is shown positioned between a pair of device wafers 92, and this sequence may be repeated throughout the length of a boat. This arrangement results in one side of each device wafer 92 being exposed to the face of a diffusion source wafer 94. A similar wafer loading configuration is used for phosphine boats when phosphorus is diffused into silicon wafers.

The device wafers should be an equal and parallel distance from their respective source wafers to improve the diffusion uniformity. Since the diffusion wafers are normally thicker than the device wafers, the slots 96 in the rods 98 and 99 are wider than the slots 100 for the wafers 92. Thus the slot width sequence is narrow-narrow-wide-narrow-narrow-wide, etc. As with the previously described arrangements, the slots are angled slightly with respect to vertical so that the wafers 92 and 94 will all tilt in the same direction in spaced parallel relation. Such an arrangement of course provides all of the advantages set forth above in connection with the other boat designs.

While the boats described above are particularly useful when made of quartz, which must be subjected to heating and cooling of processing furnaces, the same design may be employed for other wafer processing and handling boats as well.

Figure 9:
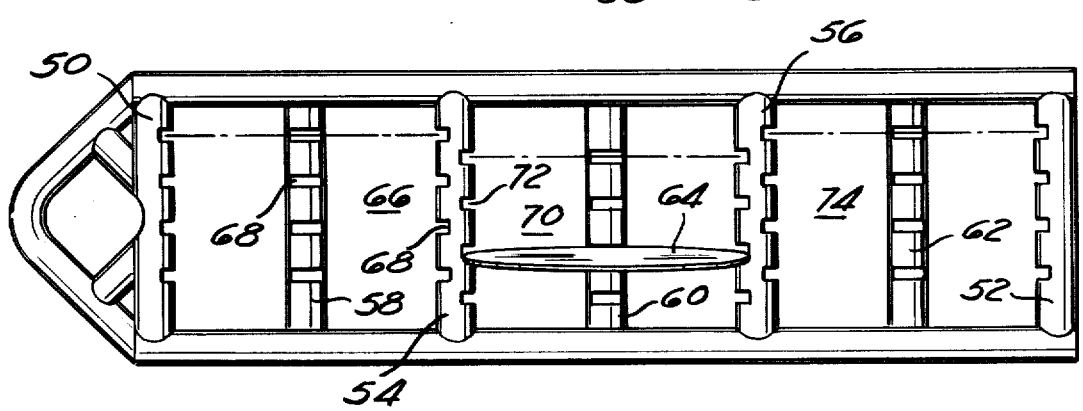
FIG. 9 is a plan view of a carrier of the type illustrated in FIG. 8.

FIGS. 8 and 9 illustrate another form of carrier utilizing the angled slot design. This carrier employs four longitudinally extending spaced parallel rods 40, 42, 44 and 46. These rods form an elongated frame when tied together and spaced by a pair of curved end rods, the front one of which is shown at 48 in FIG. 8. Additionally, the upper rods 40 and 42 are joined to a plurality of transversely extending wafer supporting rods, including a pair of end rods 50 and 52 and inner rods 54 and 56. Extending between the lower longitudinal rods 44 and 46 are three spaced parallel wafer supporting rods 58, 60 and 62. Each of the transversely extending rods is provided with a plurality of spaced parallel slots aligned to support wafers 64 in spaced parallel relation generally parallel to the longitudinal direction of the frame. More particularly, the transverse rods 50, 54 and 58 define one basket space 66 for receiving wafers, with each rod having four equally spaced, parallel, aligned slots 68 for supporting the edges of four wafers. Similarly, the rods 54, 56 and 60 define basket space 70 for receiving a group of wafers, with those three rods having slots 72 arranged in spaced, parallel aligned relation for receiving the edges of four wafers. Note that the slots 68 in one side of the rod 54 are offset with respect to the slots 72 on the other side of the rod 54. The rods 56, 52 and 62 define a third area 74 for receiving a group of wafers in the desired spaced relation. As with the arrangement of FIG. 1, the slots in boat of FIGS. 8 and 9 are oriented so that the wafers are tilted a slight amount with respect to vertical.

One of the advantages of having wafers oriented as shown in FIGS. 8 and 9, generally parallel to the longitudinal axis of the boat is that when such a boat is positioned in a heat treating furnace, such as schematically illustrated at 80 in FIG. 8, the processing gas flow through the furnace is more uniformly applied to the faces of the wafers than with the wafer orientation shown in FIG. 1.

Positioned on the forward end of the boat shown in FIGS. 8 and 9 is a curved rod 82 attached to the forward ends of the rods 44 and 46 to serve as a tow bar. A pair of short supporting struts 84 connect the curved rod 82 to the lower, transverse portion 48a of the curved rod 48. The inner edge of the curved rod 82 and the forward edge of the rod portion 48a together with the struts 84 define enclosed area 86 adapted to receive a hook 88a on one end of an elongated rod-like tool 88. In the forward surface of the rod portion 48a is formed a forwardly facing, centrally located recess 90 which is curved to conform to the exterior of the hook 88a.

The purpose for the tool 88 and the area 86 is to facilitate insertion and withdrawal of the wafer boat from the cylindrical furnace 80. When the boat is to be pushed into the furnace, the hook 88a of the tool 88 is positioned in the enclosed area 86, and the hook 88a fits into the recess 90. Since the recess 90 is centrally positioned on the rod portion 48a, and its curvature mates with the exterior of the hook, the arrangement is very helpful in pushing the boat in a straight line into the furnace onto bottom wall of the furnace. Prior art boats having an arrangement similar to that shown, but without the recess 90, do not work very satisfactorily in that it is difficult to have the tool engage the center of the rod 48 and difficult to have the tool maintain this position during pushing, with the result that the wafer boat is often pushed in a manner that causes it to roll sideways, climbing up the side of the furnace. This can cause a boat to tip, dumping the wafers into the furnace or can cause wafers to tilt out of their parallel relation.

When the boat is to be removed from the furnace, the hook is positioned into the area 86 and is guided into the curve or recess on the back side of the forward rod 82 so that the pulling action is in a straight line at the desired location.

One prior art arrangement employs a single small diameter, centrally positioned hole instead of the large area 86. The hole snugly receives the hook 88a. While this approach is quite satisfactory for purposes of pushing and pulling a boat in a straight line, it is unsatisfactory because of the difficulty of inserting the hook into a small diameter hole when a boat to be removed is in the furnace. The tool 88 may extend for four feet such that an operator standing outside the furnace holding one end of the rod has a very difficult time inserting the hook on the other end of the rod into such a small opening. The arrangement of FIGS. 8 and 9 avoids that problem.

What is claimed is:

1. A carrier for supporting semiconductor wafers during processing of the wafers including means defining a plurality of closely spaced, parallel slots for receiving and supporting a plurality of wafers in a generally edgewise position, the improvement wherein the width of a slot is such that a wafer can be easily installed and removed from a slot and will at no time become wedged in the slot during the processing of the wafers or handling of the carrier, and said slots including side slots for engaging side edges of said wafers and which are formed by spaced, parallel walls which are oriented at a slight angle with respect to vertical and the wafers each lean in the same direction against a corresponding wall in each slot and thereby are supported in spaced parallel relation to each other at the same angle as the side slot wall angle.

2. The carrier of claim 1 wherein the slot width is in the range of 0.010 to 0.030 inches greater than the edge of the wafer to be received within the slot.

3. The carrier of claims 1 or 2 wherein the slots are angled approximately 2 degrees away from vertical.

4. The carrier of claim 1 wherein the means defining the slots include a plurality of spaced parallel rods having said slots formed therein.

5. The carrier of claim 4 wherein there are three rods and the carrier includes means for supporting said three rods so that one rod receives the lower edge of a wafer and the other two rods receive the side edges of the wafer.

6. The carrier of claim 1 including means at the forward end of the carrier defining an enclosed area for receiving the hook of a tool for pushing the carrier into a furnace or pulling the carrier out of the furnace, the size of said area being considerably greater than the diameter of the hook, the means defining said enclosed area including a rear centrally located portion formed to receive said hook when the hook is used to push said carrier, so that the pushing force is centrally located, with the result that said carrier is likely to be pushed in a straight line path in the desired direction.

7. The carrier of claim 1 wherein said carrier includes an elongated supporting frame and a plurality of transversely extending rods supported on said frame in spaced parallel relation to form a plurality of wafer receiving areas, with said slots being formed in said transversely extending rods, such that the faces of the wafers positioned in said slots extend generally parallel to the elongated direction of said frame.

8. The carrier of claim 7 wherein said frame comprises a plurality of rods including a pair of upper support rods and a pair of lower support rods forming a generally rectangular frame, and said transversely extending rods include a lower rod supported on said lower pair of support rods and a pair of upper rods supported on said pair of upper support rods, whereby said wafers are supported in the space between the upper and lower transversely extending rods.

9. The carrier of claim 1 wherein said slots are formed in a sequence of two narrow slots followed by a wider slot, by two additional narrow slots and a wider slot so that device wafers may be positioned in the narrow slots and diffusion wafers in the wider slots.

10. The carrier of claims 1 or 2 wherein said slots have a generally U-shaped configuration, and the bottom wall of the slot is sloped with respect to horizontal with the lowest portion of the bottom wall being adjacent to the wall adjacent which the wafers lean.

* * * * *